United States Patent
Niimi et al.

(10) Patent No.: US 7,393,787 B2
(45) Date of Patent: Jul. 1, 2008

(54) FORMATION OF NITROGEN CONTAINING DIELECTRIC LAYERS HAVING A UNIFORM NITROGEN DISTRIBUTION THEREIN USING A HIGH TEMPERATURE CHEMICAL TREATMENT

(75) Inventors: Hiroaki Niimi, Dallas, TX (US); Reima T. Laaksonen, Dallas, TX (US); Mahalingam Nandakumar, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 153 days.

(21) Appl. No.: 11/209,140

(22) Filed: Aug. 22, 2005

(65) Prior Publication Data
US 2007/0042559 A1 Feb. 22, 2007

(51) Int. Cl.
*H01L 21/302* (2006.01)
(52) U.S. Cl. .................................................. 438/689
(58) Field of Classification Search ................. 438/733, 438/216, 287, 689
See application file for complete search history.

(56) References Cited

U.S. PATENT DOCUMENTS

| 6,730,566 B2 * | 5/2004 | Niimi et al. ................. 438/275 |
| 2005/0197273 A1 * | 9/2005 | Savu et al. .................. 510/412 |
| 2006/0054181 A1 * | 3/2006 | Rayandayan et al. ........... 134/1 |

\* cited by examiner

*Primary Examiner*—Thao P. Le
(74) *Attorney, Agent, or Firm*—Frederick J. Telecky, Jr.; Wade J. Brady, III

(57) ABSTRACT

The present invention provides a method for manufacturing a gate dielectric, a method for manufacturing a semiconductor device, and a method for manufacturing an integrated circuit. The method for manufacturing the gate dielectric, without limitation, may include forming a nitrided dielectric layer (520) over a substrate (310), the nitrided dielectric layer (520) having a non-uniformity of nitrogen in a bulk thereof, and removing at least a portion of the nitrided dielectric layer (520) using a high temperature chemical treatment, the removing reducing the non-uniformity.

11 Claims, 6 Drawing Sheets

FORMATION OF NITROGEN CONTAINING DIELECTRIC LAYERS HAVING A UNIFORM NITROGEN DISTRIBUTION THEREIN USING A HIGH TEMPERATURE CHEMICAL TREATMENT

TECHNICAL FIELD OF THE INVENTION

The present invention is directed, in general, to a method for manufacturing gate dielectric layers and, more specifically, to the formation of nitrided gate dielectric layers having a uniform nitrogen distribution therein using a high temperature chemical treatment.

BACKGROUND OF THE INVENTION

In certain semiconductor applications it has become necessary to integrate dual gate oxide (DGO) thicknesses for associated transistor devices onto a single integrated circuit device. One motivation for performing dual gate oxide processing is that high performance transistors typically operate at lower voltages (e.g., 0.8 volts to 1.5 volts), and thus require thinner gate dielectric regions, whereas devices that interface with most conventional external peripherals typically require higher operating voltages (e.g., 1.8 volts to 3.5 volts), and thus require thicker gate dielectric regions. When interfacing lower voltage high performance metal-oxide-semiconductor field-effect-transistors (MOSFETs) within a core of an integrated circuit, to higher voltage peripheral devices, input and output (I/O) buffers of the integrated circuit (IC) are typically designed to contain thicker gate dielectric regions that are compatible with the higher external peripheral device voltages.

For example, current microcontroller units (MCUs) and digital signal processors (DSPs) are integrating several different types of technology onto a single integrated circuit, such as high speed logic, power logic, static random access memory (SRAM), nonvolatile memory (NVM), embedded dynamic random access memory (DRAM), analog circuitry, and other devices and technologies. Many of these devices require different gate dielectric processing and different gate dielectric thicknesses to provide both high performance lower voltage devices within the core of the device and higher voltage I/O devices to interface with external peripheral devices.

As stated above, a dual gate thickness structure includes thin gate dielectrics for high performance low voltage operation core devices, and thick gate dielectrics for low leakage high voltage operation I/O devices. As devices shrink, even the thick gate dielectrics are getting thinner to meet device requirements. This can cause increased leakage current for the devices, especially the high voltage devices having the thick gate dielectrics.

It has generally been accepted that the leakage current can be mitigated by introducing nitrogen atoms into the gate dielectrics to suppress leakage currents for both the thin and thick gates. One method of nitrogen atom introduction includes performing non-thermal nitridation (e.g., plasma nitridation) on the gate dielectrics. Unfortunately, this and other methods of introducing the nitrogen atoms into the gate dielectrics tend to provide a non-uniform nitrogen profile in the gate dielectric, which results in reduced reliability. The non-uniformity, and thus reduced reliability, is particularly significant in thicker gate dielectrics, such as those used in the aforementioned high voltage devices.

Turning to FIG. 1, depicted is a graph 100 illustrating the nitrogen profile 110 and oxygen profile 120 in a gate dielectric manufactured using one of the aforementioned nitrogen inclusion techniques. In observing the nitrogen profile 110 in the gate dielectric layer, those skilled in the art understand focus should be made on the bulk region of the dielectric layer, wherein the nitrogen profile is a true representation of the dielectric layer. Accordingly, the bulk region of the dielectric layer is generally defined to exclude, on the lower limit, the first 0.3 nm of the dielectric layer, represented by the line 130, and exclude, on the upper limit, anything past where the oxygen profile 120 decreases to about 90% of an average oxygen concentration within the bulk region, as represented by a line 140.

A non-uniformity (N.U.) of the nitrogen concentration in the bulk region may be defined to quantify differences between films. The definition applied in the context of the present invention is $$\% N.U. = \frac{[N]_{max} - [N]_{min}}{[N]_{avg}} * 100 \quad (1)$$

Using this equation, the non-uniformity of the nitrogen within the dielectric layer represented in the graph 100 is at least 135 percent if not 140 percent or more. As indicated above, this non-uniformity introduces reliability issues. The graph 100 thereby illustrates that conventional manufacturing techniques are generally unable to obtain nitrogen non-uniformity values in the bulk of the dielectric layers less than about 100 percent.

Accordingly, what is needed in the art is a method for including nitrogen within a dielectric layer that will result in improved non-uniformity values in the bulk region thereof.

SUMMARY OF THE INVENTION

To address the above-discussed deficiencies of the prior art, the present invention provides a method for manufacturing a gate dielectric, a method for manufacturing a semiconductor device, and a method for manufacturing an integrated circuit. The method for manufacturing the gate dielectric, without limitation, may include forming a nitrided dielectric layer over a substrate, the nitrided dielectric layer having a non-uniformity of nitrogen in a bulk thereof, and removing at least a portion of the nitrided dielectric layer using a high temperature chemical treatment, the removing reducing the non-uniformity.

The method for manufacturing a semiconductor device, in addition to that included within the method for manufacturing the gate dielectric, may include forming a gate electrode over the gate dielectric. Similarly, the method for manufacturing the integrated circuit may include that mentioned directly above with respect to the method for manufacturing the semiconductor device, with the addition of patterning the gate dielectric and gate electrode to form one or more gate structures, and forming interlevel dielectric layers over the one or more gate structures, the interlevel dielectric layers having interconnects therein for forming an operational integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

Prior Art

DETAILED DESCRIPTION

Figure 2A:
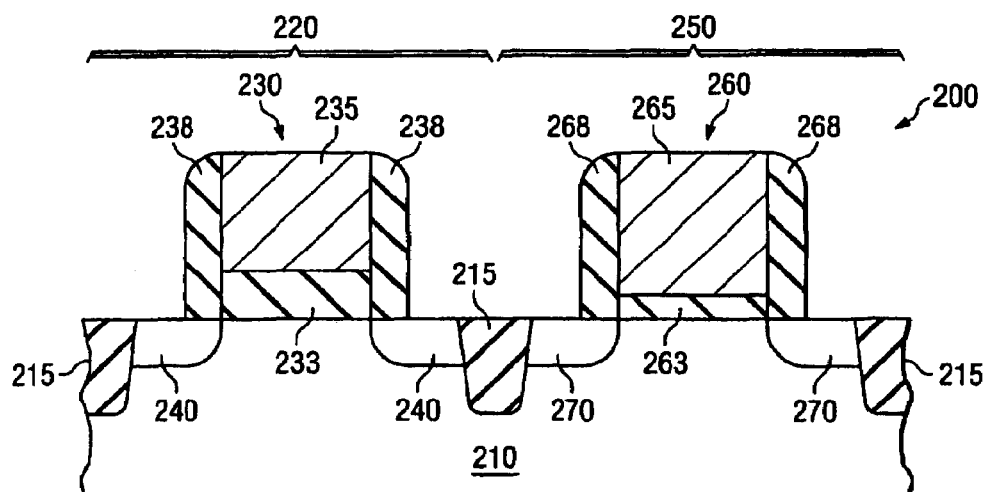
FIG. 2A illustrates a cross-sectional view of a semiconductor device manufactured in accordance with the principles of the present invention.

Referring initially to FIG. 2A, illustrated is a cross-sectional view of a semiconductor device 200 manufactured in accordance with the principles of the present invention. The semiconductor device 200 initially includes a semiconductor substrate 210. The semiconductor substrate 210, in the embodiment of FIG. 2A, has isolation structures 215 located therein. The isolation structures 215 may be any isolation structures used in conventional semiconductor devices, including shallow trench isolation structures, field oxide isolation structures, etc.

As is illustrated in FIG. 2A, the isolation structures 215 divide the semiconductor device 200 into first and second transistor device regions. More particularly in the embodiment of FIG. 2A, the isolation structures 215 divide the semiconductor device 200 into a first high voltage device region 220 and a second lower voltage device region 250. As those skilled in the art appreciate, the first high voltage device region 220 might be configured to providing a low leakage, high voltage operation (e.g., about 1.8 volts to about 3.5 volts) input/output device, wherein the second lower voltage device region 250 might be configured to provide a high performance low voltage operation (e.g., about 0.8 volts to about 1.5 volts) core device. It is to be appreciated that the first and second device regions 220, 250, are provided for illustrative purposes, and that the semiconductor device 200 can include a plurality of the first high voltage device regions 220 and second lower voltage device regions 250 without departing from the scope of the present invention.

The first high voltage device region 220 illustrated in FIG. 2A initially includes a gate structure 230. As is common with most gate structures, the gate structure 230 includes a gate dielectric 233. Because the gate structure 230 forms a part of what will ultimately be a high voltage structure, the gate dielectric 233 comprises a thick gate dielectric. For example, the gate dielectric 233 in the high voltage device region 220 could advantageously have a thickness ranging from about 1.5 nm to about 3.5 nm, or greater. Nevertheless, other thicknesses outside this range could be used.

The gate dielectric 233 can be an oxide (e.g., silicon dioxide ($SiO_2$)) or a dielectric material suitable for operating as a gate dielectric structure of a transistor device. Since the gate dielectric 233 is relatively thin in comparison to conventional thick gate dielectric layers, nitrogen atoms have been introduced into the gate dielectric 233 to suppress leakage currents associated with the operation of the gate structure 230. The nitrogen atoms can be introduced into the gate dielectric 233 using a number of different processes, however, one embodiment of the present invention introduces the nitrogen atoms into the gate dielectric 233 using a radical nitridation process. A nitrided gate dielectric, such as silicon oxy-nitride, may result after introducing the nitrogen atoms into the gate dielectric 233.

The gate structure 230 also includes a gate electrode 235 disposed over the gate dielectric 233. The gate electrode 235 may comprise, without limitation, polysilicon, amorphous silicon, germanium, silicon-germanium, or metal. Sidewall spacers 238 of a suitable insulating material may be disposed adjacent to the sidewalls of the gate dielectric 233 and gate electrode 235. Conventional source/drain regions 240 may be formed within the substrate 210 proximate the gate structure 230.

The second lower voltage device region 250 may include a second gate structure 260. As is illustrated in FIG. 2A, the second gate structure 260 may include a second gate dielectric 263 located over the substrate 210. Because the second gate dielectric 263 forms a part of what will ultimately be a high performance lower voltage structure, the second gate dielectric 263 comprises a thinner gate dielectric. For example, the second gate dielectric 263 in the lower voltage device region 250 could advantageously have a thickness ranging from about 0.8 nm to about 1.4 nm. Nevertheless, other thicknesses outside this range could be used.

The second gate dielectric 263 may also be an oxide (e.g., silicon dioxide ($SiO_2$)) or a dielectric material suitable for operating as a gate dielectric structure of a transistor device. Nitrogen atoms may also be introduced into the second gate dielectric 263 to suppress leakage currents associated with the operation of the gate structure 260. The nitrogen atoms can be introduced into second gate dielectric 263 using a similar process as used to introduce the nitrogen atoms into the gate dielectric 233. A nitrided gate dielectric, such as silicon oxy-nitride, may also result after introducing the nitrogen atoms into the second gate dielectric 263. As leakage is often more problematic for high voltage devices, certain embodiments of the present invention may exist wherein the second gate dielectric 263 does not contain the nitrogen therein.

The gate structure 260 also includes a second gate electrode 265 disposed over the second gate dielectric 263. The second gate electrode 265 may comprise, without limitation, polysilicon, amorphous silicon, germanium, silicon-germanium or metal. Sidewall spacers 268 of a suitable insulating material may be disposed adjacent to the sidewalls of the second gate dielectric 263 and second gate electrode 265. Conventional source/drain regions 270 may also be formed within the substrate 210 proximate the gate structure 260.

While not illustrated, the source/drain regions 240 and 270 can also include source/drain extensions that extend to regions generally aligned with and partially beneath the respective edges of the gate electrodes 235 and 265. Those skilled in the art will understand and appreciate that first and second device regions 220, 250 can include either P type or N type transistors. The source/drain regions 240 and 270 can be formed as N or P type regions by doping with boron, arsenic or other appropriate doping materials, as known in the art.

Figure 2B:
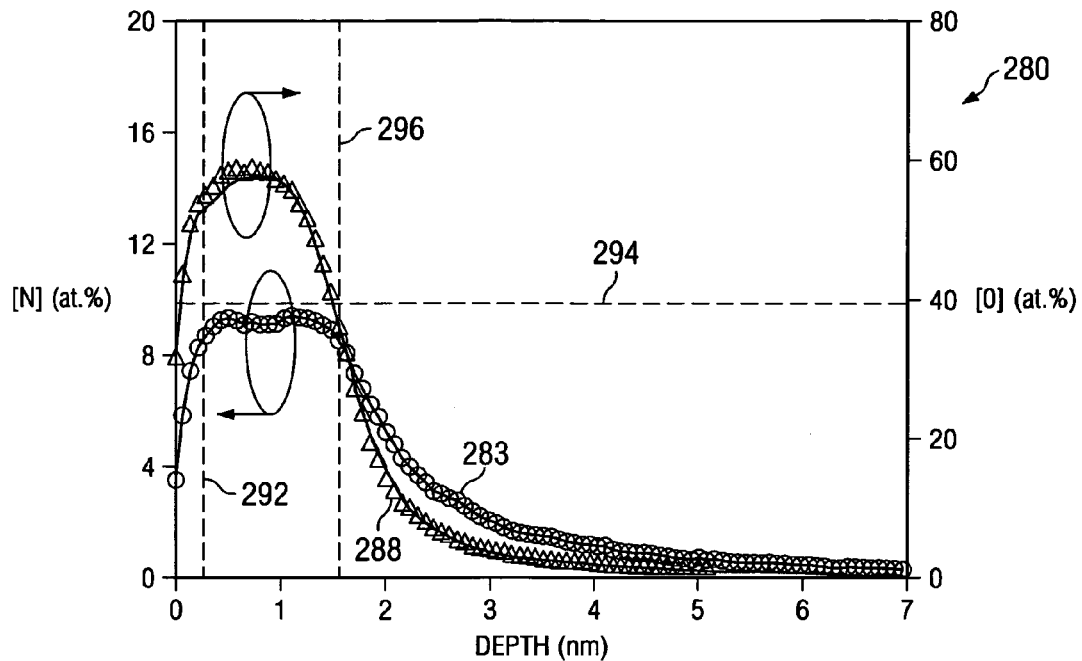
FIG. 2B illustrates a graph illustrating the nitrogen concentration and oxygen concentration in a gate dielectric manufactured in accordance with the principles of the present invention.

Turning now to FIG. 2B, shown is a graph 280 illustrating the nitrogen concentration and oxygen concentration in a gate dielectric manufactured in accordance with the principles of the present invention. The gate dielectric is representative of the gate dielectric 233, and will be referred to as such in the discussion of the graph 280. A nitrogen profile 283, portrayed as circles, shows the measured concentration of nitrogen, [N], with increasing depth in the gate dielectric 233. An oxygen profile 288, portrayed as triangles, shows the measured concentration of oxygen, [O], with increasing depth in the gate dielectric 233. Both the nitrogen profile 283 and oxygen profile 288 were determined by time-of-flight secondary ion mass spectrometry (ToF-SIMS).

For purposes of this discussion, the gate dielectric 233 may be characterized as having a surface region and a bulk region. Each of the surface region and the bulk region may be defined in relation to the surface of the gate dielectric 233 and the oxygen profile 288. The surface region is defined to begin at the surface of the gate dielectric 233, and extend to a depth of about 0.3 nm, as indicated by a line 292. The bulk region extends from about 0.3 nm until the oxygen profile 288 decreases to about 90% of an average oxygen concentration within the bulk region, as indicated by a line 294. The depth corresponding to the intersection of the oxygen profile 288 and the line 294, as indicated by a line 296, is the lower extent of the bulk region, or about 1.8 nm in the graph 280. Those skilled in the art will appreciate that the thickness of the bulk region will depend on the total thickness of the gate dielectric 233.

A non-uniformity (N.U.) of the nitrogen concentration in the bulk region may be defined to quantify differences between films. The definition applied in the context of the present invention is $$\% \ N.U. = \frac{[N]_{max} - [N]_{min}}{[N]_{avg}} * 100 \quad (2)$$

For the purposes of the invention, a non-uniformity less than about 25 percent is considered to be substantially uniform. Many of the conventional techniques for manufacturing the gate dielectrics provide a nitrogen non-uniformity of 100 percent or greater. Thus defined, the non-uniformity of the nitrogen concentration of the bulk region of the gate dielectric 233 in the graph 280 is computed to be about 8%, which is an order of magnitude below that which is generally attainable using conventional methods, and substantially below the upper level of what is considered uniform (e.g., 25 percent). Accordingly, the inventive methodology of the present invention is capable of providing gate dielectrics having substantially uniform nitrogen concentrations therein.

While the graph 280 illustrates the nitrogen profile 283 and oxygen profile 288 of the gate dielectric 233 illustrated in FIG. 2A, a similar graph might have been taken for the gate dielectric 263 illustrated in FIG. 2A. In reality, the gate dielectric 263 of FIG. 2A may have a better nitrogen non-uniformity than the gate dielectric 233, as the non-uniformity is less significant in the thinner gate dielectrics. As one would now expect, the reduced non-uniformity in the gate dielectric 233 or gate dielectric 263 may result in improved reliability.

Turning now to FIGS. 3-11, illustrated are cross-sectional views illustrating how one skilled in the art might manufacture a semiconductor device in accordance with the principles of the present invention. While FIGS. 3-11 are specifically directed to the manufacture of a semiconductor device, FIGS. 3-11 also illustrate, in a broad sense, how one skilled in the art might manufacture a gate dielectric with improved nitrogen uniformity, in accordance with the principles of the present invention. Thus, a method for manufacturing a gate dielectric is discussed within the confines of discussing how one skilled in the art might manufacture a semiconductor device with respect to FIGS. 3-11. Nevertheless, while each of these ideas is discussed and illustrated using a single set of FIGURES, neither should be limiting on the other.

Figure 3:
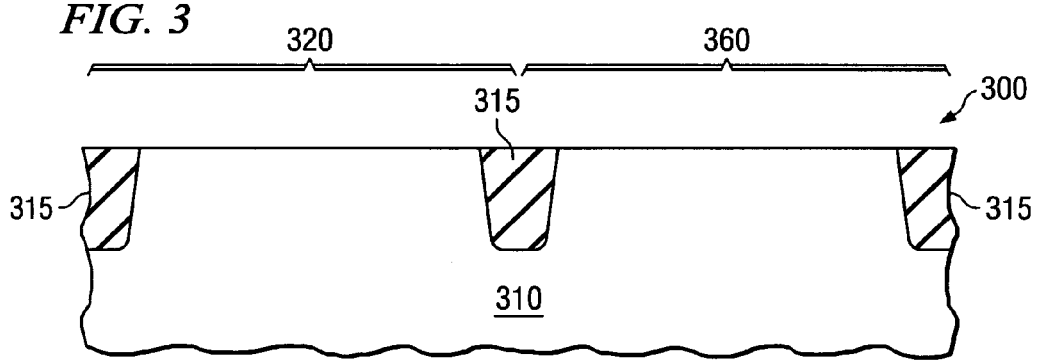
FIG. 3 illustrates a cross-sectional view of semiconductor device at an initial stage of manufacture.

FIG. 3 illustrates a cross-sectional view of semiconductor device 300 at an initial stage of gate dielectric formation. The semiconductor device 300 illustrated in FIG. 3 initially includes a substrate 310. The substrate 310 may, in an exemplary embodiment, be any layer located in the partially completed semiconductor device 300, including a wafer itself or a layer located above the wafer (e.g., epitaxial layer). Moreover, the substrate 310 is generally formed from a semiconductor material, such as silicon or polysilicon. However, the substrate 310 may also be formed from other materials such as gallium arsenide, germanium, silicon-germanium, epitaxial formations, silicon carbide, indium phosphide, silicon-on-insulator substrates (SOI), strained silicon substrates, and/or other semiconductor substrate materials. Nevertheless, in the illustrative embodiment shown, the substrate 310 comprises an epitaxial silicon layer.

Formed within the substrate 310 and breaking the semiconductor device into a first high voltage device region 320 and a second lower voltage device region 360 are isolation structures 315. The isolation structures 315 illustrated in FIG. 3 happen to be shallow trench isolation structures, nevertheless, other embodiments exist wherein the isolation structures differ from those shown. For example, another known embodiment use field oxide isolation structures in place of the shallow trench isolation structures shown.

As just mentioned, the isolation structures 315 in the embodiment of FIG. 3 break the semiconductor device 300 into the first high voltage device region 320 and the second lower voltage device region 360. The first high voltage device region 320 might include transistor devices configured to operate at high voltages (e.g., about 1.8 volts to about 3.5 volts) and the second lower voltage device region 360 might include transistor devices configured to operate at lower voltages (e.g., about 0.8 volts to about 1.5 volts). However, the present invention should not be limited to the aforementioned voltages.

Figure 4:
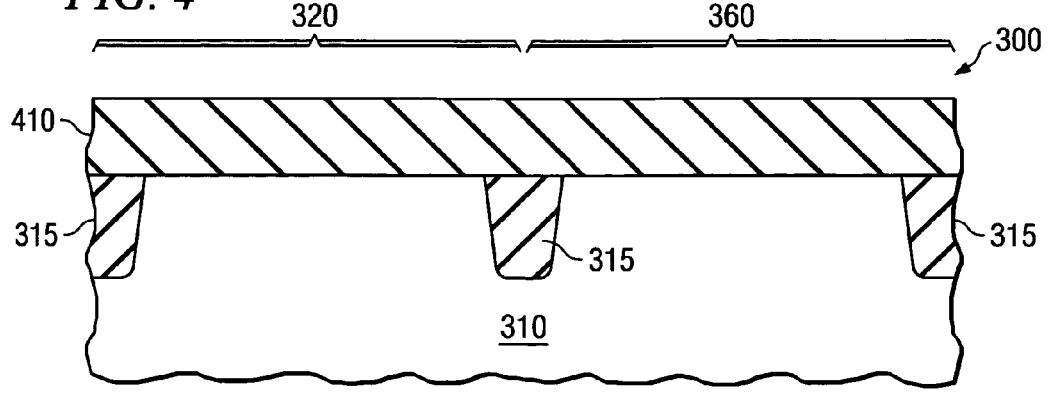
FIG. 4 illustrates a cross-sectional view of the partially completed semiconductor device illustrated in FIG. 3 after forming a gate dielectric layer over the substrate.

Turning now to FIG. 4, illustrated is a cross-sectional view of the partially completed semiconductor device 300 illustrated in FIG. 3 after forming a gate dielectric layer 410 over the substrate 310. The gate dielectric layer 410 may have a thickness of about 2.0 nm to about 4.5 nm, among others, while remaining within the purview of the present invention. As will be understood further below, this thickness should take into account any portion of the gate dielectric layer 410 that is subsequently removed using the high temperature chemical treatment discussed below. In an exemplary embodiment, the final thickness of the gate dielectric layer might range from about 1.5 nm to about 3.5 nm.

The gate dielectric layer 410 may be formed many different ways, however, in the embodiment of FIG. 4 an oxidation process is initiated to form the gate dielectric layer 410 (e.g., silicon dioxide ($SiO_2$) layer) over the substrate 310. In an exemplary embodiment, the gate dielectric layer 410 is formed using a wet and/or dry thermal oxidation processing. It is to be appreciated that alternate methodologies can be employed to form the gate dielectric layer 410. For example, any suitable technique (e.g., thermal oxidation, plasma enhanced chemical vapor deposition (CVD), rapid thermal enhanced CVD (RTCVD), physical vapor deposition (PVD), spin on techniques and film growth techniques) may be employed in forming the gate dielectric layer 410.

Additionally, alternate materials can be employed to provide the gate dielectric layer 410. The gate dielectric layer 410, for example, is $SiO_2$ or another suitable oxide material that can perform the operation associated with the gate dielectric layer 410. Examples of some materials that could be used as the gate dielectric layer 410 include $AlO_3$, $ZrO_2$, $HfO_2$ (AlHf) $O_x$, $HfO_2$, $La_2O_3$ and $Y_2O_3$ to name a few. Those skilled in the art will understand and appreciate the appropriate types of techniques that can be employed to form the gate dielectric layers, such as those identified above.

Figure 5:
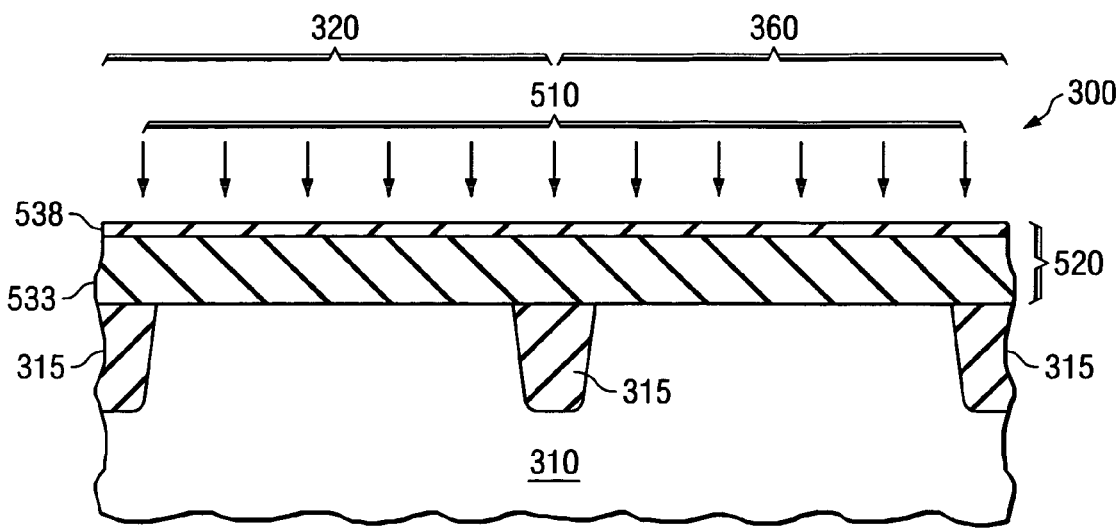
FIG. 5 illustrates a cross-sectional view of the partially completed semiconductor device illustrated in FIG. 4 after the introduction of nitrogen into the gate dielectric layer to form a nitrided dielectric layer.

Turning to FIG. 5, illustrated is a cross-sectional view of the partially completed semiconductor device 300 illustrated in FIG. 4 after the introduction of nitrogen 510 into the gate dielectric layer 410 to form a nitrided dielectric layer 520. In one embodiment, the nitrided dielectric layer 520 is a silicon oxy-nitride dielectric layer. This, however, obviously depends on the material that the gate dielectric layer 410 comprises. As the gated dielectric layer 410 may comprise many different materials, the resulting nitrided dielectric layer 520 may also.

The nitrogen 510 may be incorporated into the gate dielectric layer 410 using a variety of different processes. However, one exemplary embodiment uses a radical nitridation process to incorporate the nitrogen 510 into the gate dielectric layer 410. For example, the radical nitridation process might use an RF power ranging from about 700 watts to about 1500 watts, a pressure ranging from about 10 mTorr to about 20 mTorr, a temperature ranging from about room temperature to about 400° C., a gas flow of nitrogen ranging from about 100 sccm to about 500 sccm, for a period of about 10 seconds to about 60 seconds, to form the nitrided dielectric layer 520. Other processing conditions could also be used.

In certain situations, the inclusion of nitrogen 510 into the gate dielectric layer 410 causes the nitrided dielectric layer 520 to have an undamaged region 533 and a plasma damaged region 538. It is believed that the damages region is caused by the high powers used in the aforementioned radical nitridation process. Unfortunately, the plasma damaged region 538 may cause high gate leakage, threshold voltage shifts, premature dielectric breakdown, or thermal unstability when the device is in operation.

Figure 1:
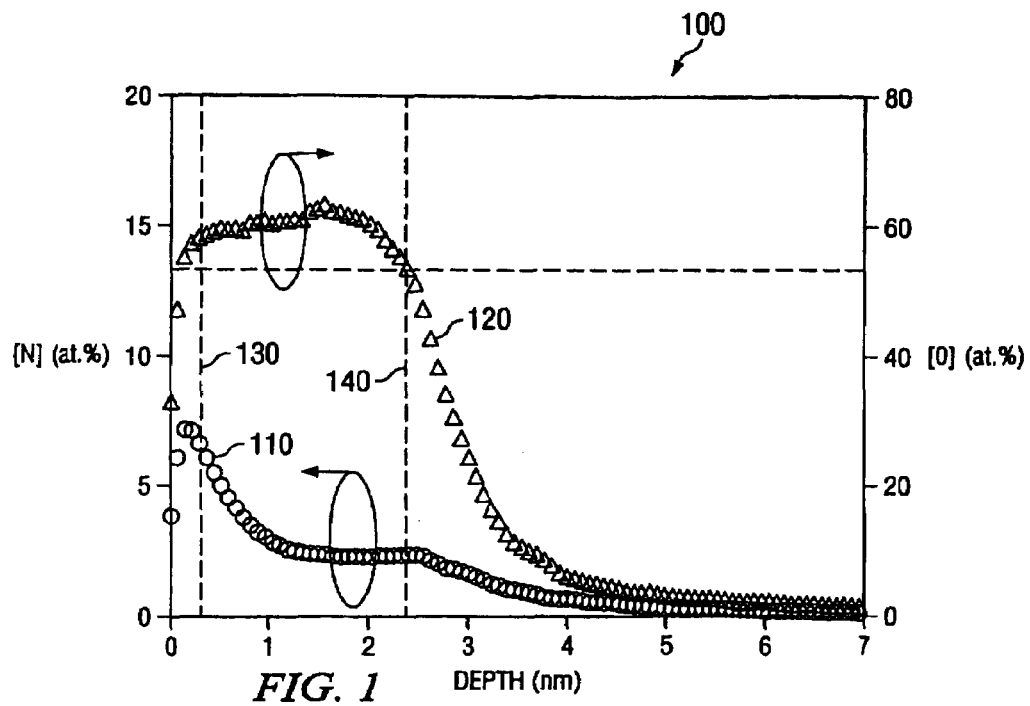
FIG. 1 illustrates a graph depicting the non-uniformity of nitrogen within a dielectric layer manufactured using conventional techniques.

As mentioned a number of times, the inclusion of the nitrogen 510 within the thicker gate dielectric layer 410 will often cause the nitrogen therein to have a non-uniform profile in the bulk portion therein. If one were to look at the nitrogen profile of the gate dielectric layer 410 at this point in the manufacturing process, it would look somewhat similar to the nitrogen profile 110 illustrated in FIG. 1. Accordingly, the nitrogen profile of the gate dielectric layer 410 at this point of manufacture would typically have a non-uniformity of about 100 percent or greater.

Figure 6:
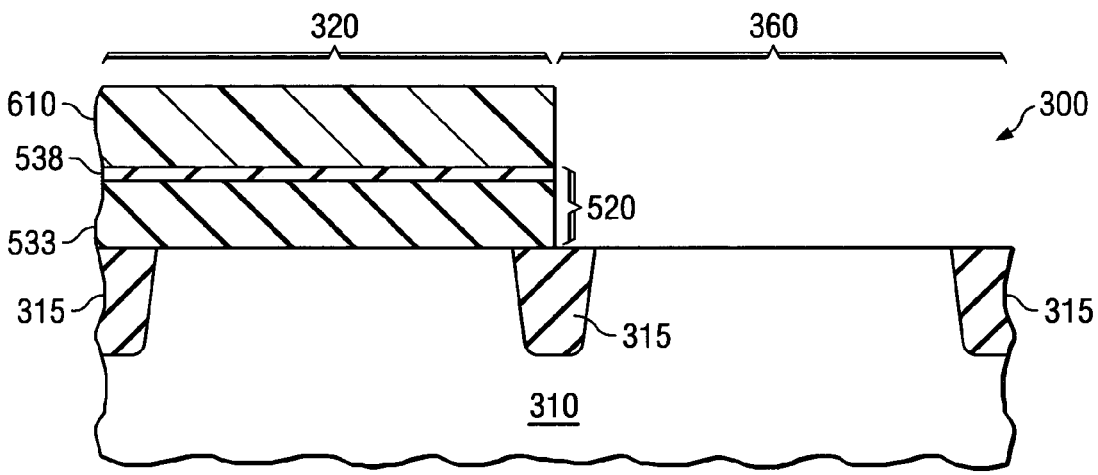
FIG. 6 illustrates a cross-sectional view of the partially completed semiconductor device illustrated in FIG. 5 after blanket depositing a photoresist layer over the entire surface of the semiconductor device, patterning the blanket photoresist layer resulting in the patterned photoresist layer, and then using the patterned photoresist layer as a mask to etch the exposed portions of the nitrided dielectric layer.

Turning now to FIG. 6, illustrated is a cross-sectional view of the partially completed semiconductor device 300 illustrated in FIG. 5 after blanket depositing a photoresist layer over the entire surface of the semiconductor device 300, patterning the blanket photoresist layer resulting in the patterned photoresist layer 610, and then using the patterned photoresist layer 610 as a mask to etch the exposed portions of the nitrided dielectric layer 520. As is illustrated in FIG. 6, the patterned photoresist layer 610 remains in the first high voltage device region 320, thereby exposing the second lower voltage device region 360. As the processes used to form and pattern the patterned photoresist layer 610 are conventional, no further detail need be given.

Any suitable etch technique may be used to etch the exposed portion of the nitrided dielectric layer 520. For example, most any wet etch process may be employed to remove the exposed portion of the nitrided dielectric layer 520 from the substrate 310. Preferably, a selective etch technique is used to etch the nitrided dielectric layer 520 at a relatively greater rate as compared to the rate of the patterned photoresist layer 610 and the underlying substrate 310.

Figure 7:
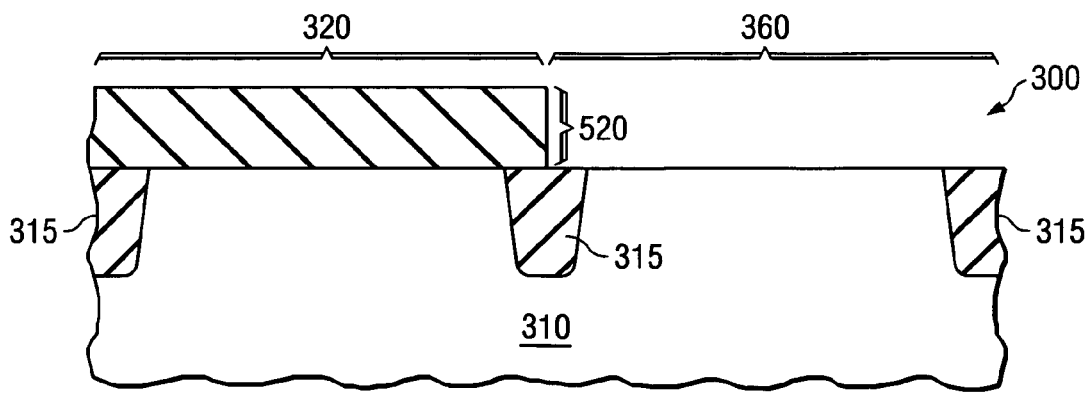
FIG. 7 illustrates a cross-sectional view of the partially completed semiconductor device illustrated in FIG. 6 after removing the patterned photoresist layer and then removing at least a portion of the nitrided dielectric layer using a high temperature chemical treatment.

Turning now to FIG. 7, illustrated is a cross-sectional view of the partially completed semiconductor device 300 illustrated in FIG. 6 after removing the patterned photoresist layer 610 and then removing at least a portion of the nitrided dielectric layer 520 using a high temperature chemical treatment. The removing of the portion of the nitrided dielectric layer 520 advantageously reduces the aforementioned non-uniformity. In an exemplary embodiment, the high temperature chemical treatment removes up to about 1 nm of the nitrided dielectric layer 520 to reduce the non-uniformity. In another embodiment, the high temperature chemical treatment removes at least a portion of, or the entire damaged region 538.

The high temperature chemical treatment used to remove the portion of the nitrided dielectric layer 520 may vary. However, for the purposes of the present document, the high temperature chemical treatment uses a temperature of about 65° C. or greater. In an advantageous embodiment, the temperature ranges from about 65° C. to about 95° C., and in an exemplary embodiment ranges from about 80° C. to about 90° C. Nevertheless, many different temperatures may be used and remain within the purview of the present invention.

The high temperature chemical treatment, in one embodiment, uses a multi-step chemical treatment process. For example, one advantageous embodiment exists wherein the high temperature chemical treatment uses a three step process, the first step including a mixture of de-ionized (DI) water, ammonium hydroxide, and hydrogen peroxide, the second step including a mixture of DI water, hydrochloric acid and hydrogen peroxide, and the third step including a mixture of sulfuric acid and hydrogen peroxide. In this embodiment, the first step could be conducted using a temperature ranging from about 70° C. to about 80° C., the second step conducted using a temperature ranging from about 70° C. to about 80° C., and the third step conducted using a temperature ranging from about 70° C. to about 90° C. In an advantageous embodiment, the high temperature chemical treatment is selective to the nitrided dielectric layer 520.

Returning briefly back to FIG. 2B, the non-uniformity within the nitrided dielectric layer 520 that might result after the high temperature chemical treatment should be less than about 25 percent, and advantageously less than about 15 percent. The non-uniformity, in certain situations, may even be less than about 10 percent. As those skilled in the art are aware, the improved non-uniformity will ultimately result in a more reliable semiconductor device 300.

Figure 8:
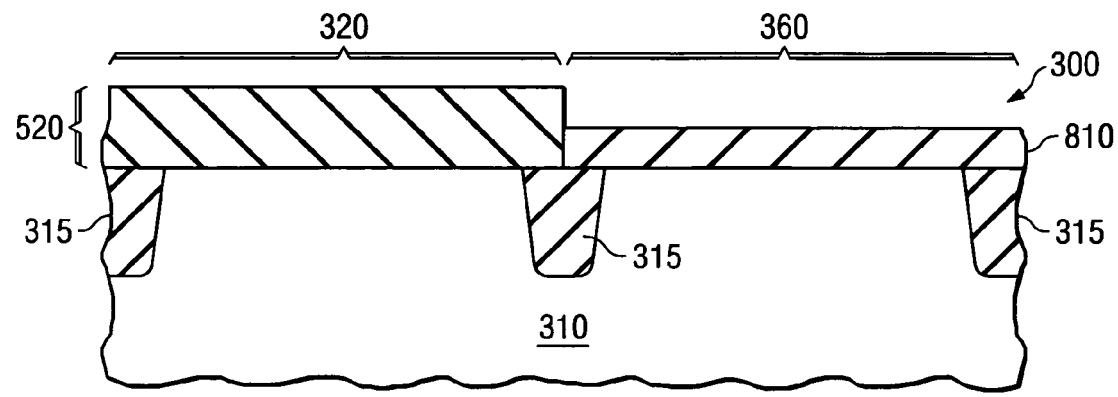
FIG. 8 illustrates a cross-sectional view of the partially completed semiconductor device illustrated in FIG. 7 after forming a second gate dielectric layer in the second low power device region.

Turning now to FIG. 8, illustrated is a cross-sectional view of the partially completed semiconductor device 300 illustrated in FIG. 7 after forming a second gate dielectric layer 810 in the second low power device region 360. In an exemplary embodiment, a wet chemical cleanup is performed on the substrate 310 prior to forming the second gate dielectric layer 810. The wet chemical cleanup can include a silicon surface cleaning process, such as an RCA (Radio Corporation of America) clean and/or a SPM (sulfuric acid-hydrogen peroxide-water solution) clean. The RCA clean is the industry standard for removing contaminants from wafers. The RCA cleaning procedure generally has three major steps (e.g., organic clean, oxide strip and ionic clean) used sequentially. However, those skilled in the art would be familiar with a variety of different wet chemical cleanup procedures that could be employed to clean the substrate 310 prior to the formation of the second gate dielectric layer 810.

The second gate dielectric layer 810 may be formed using a variety of different processes. However, in the embodiment of FIG. 8 the second gate dielectric layer 810 is formed using an oxidation process. The second gate dielectric layer 810 may advantageously have a thickness of about 0.8 nm to about 1.4 nm, and be formed by a wet and/or dry thermal oxidation processing. It is to be appreciated that alternate methodologies can be employed to form the second gate dielectric layer 810. For example, any technique suitable to form the first gate dielectric layer 410 might be used to form the second gate dielectric layer 810. Additionally, alternate materials can be employed to provide the second gate dielectric layer 810. In one advantageous embodiment, the nitrided dielectric layer 520 grows very little during the second oxidation process, since the nitrogen atoms in the nitrided dielectric layer 520 act as an oxygen block.

Figure 9:
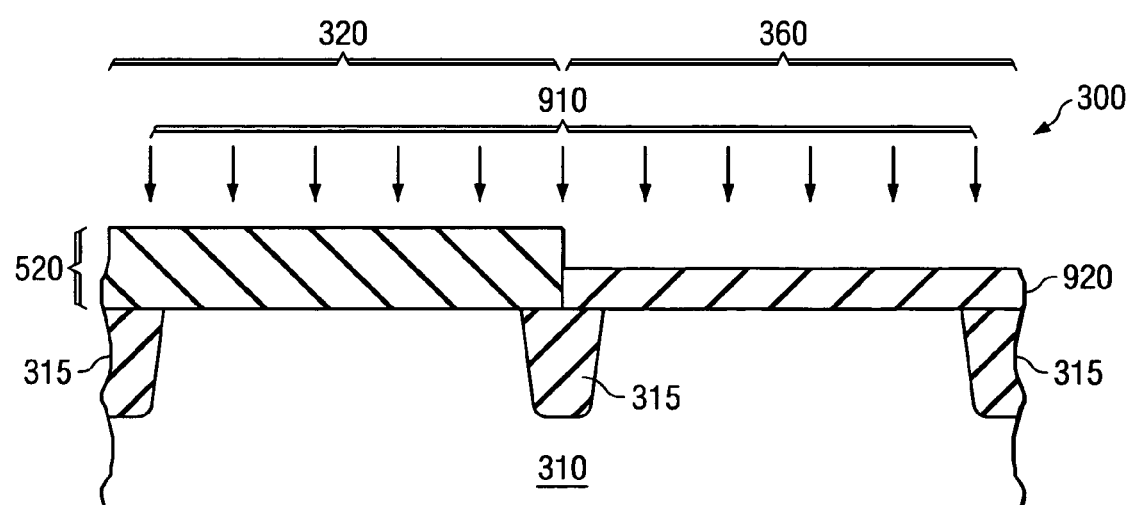
FIG. 9 illustrates a cross-sectional view of the partially completed semiconductor device illustrated in FIG. 8 after introducing nitrogen into the second gate dielectric layer.

Turning now to FIG. 9, illustrated is a cross-sectional view of the partially completed semiconductor device 300 illustrated in FIG. 8 after introducing nitrogen 910 into the second gate dielectric layer 810. The nitrogen 910 may be introduced into the second gate dielectric layer 810 using a similar process as was used to introduce the nitrogen 510 into the gate dielectric layer 410. However, the processing conditions used to introduce the nitrogen into the second gate dielectric layer 810 should be gentle enough so as to not substantially modify the nitrogen profile in the nitrided dielectric layer 520. What results from the second nitridation process is a second nitrided dielectric layer 920.

Figure 10:
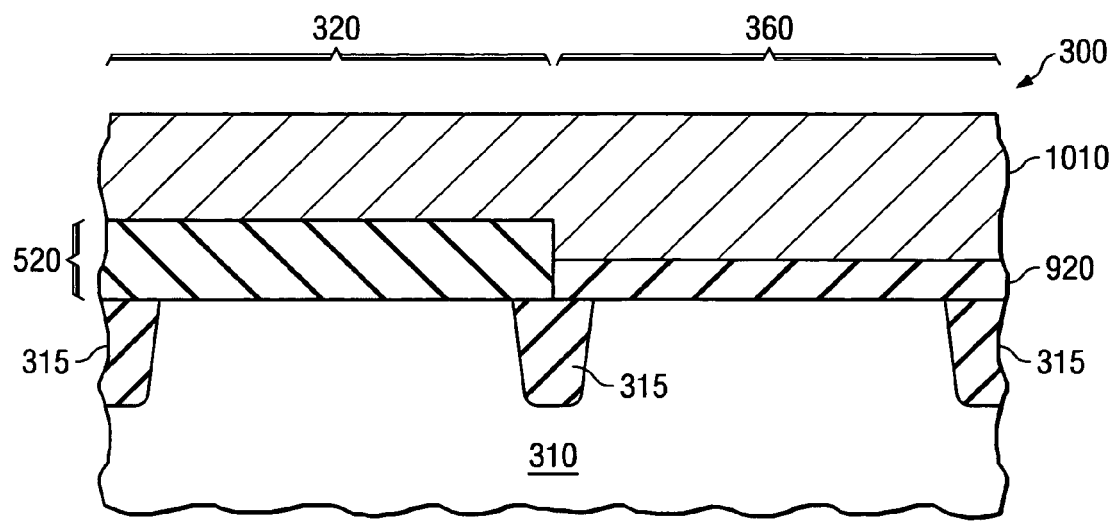
FIG. 10 illustrates a cross-sectional view of the partially completed semiconductor device illustrated in FIG. 9 after forming a blanket layer of gate electrode material over the nitrided dielectric layer and the second nitrided dielectric layer.

Turning now to FIG. 10, illustrated is a cross-sectional view of the partially completed semiconductor device 300 illustrated in FIG. 9 after forming a blanket layer of gate electrode material 1010 over the nitrided dielectric layer 520 and the second nitrided dielectric layer 920. The blanket layer of gate electrode material 1010 may, depending on its composition, be formed using any suitable technique. For example, among others, the blanket layer of gate electrode material 1010 may be formed using chemical vapor deposition (CVD) techniques, such as low pressure chemical vapor deposition (LPCVD) or plasma enhanced chemical vapor deposition (PECVD). In those embodiments wherein the blanket layer of gate electrode material 1010 is comprised of amorphous silicon, germanium, or silicon-germanium, standard deposition techniques may be employed. In those embodiments wherein the blanket layer of gate electrode material 1010 is comprised of a metal, standard sputtering techniques may be employed. The blanket layer of gate electrode material 1010 advantageously has a thickness ranging from about 80 nm to about 120 nm, but should not be limited to this thickness.

Figure 11:
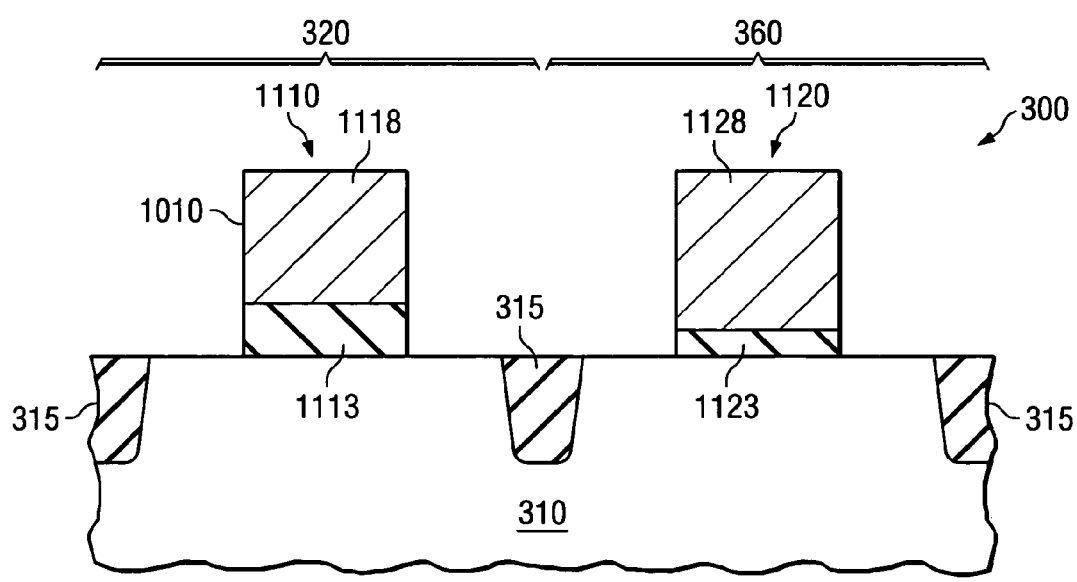
FIG. 11 illustrates a cross-sectional view of the partially completed semiconductor device illustrated in FIG. 10 after conventionally patterning the blanket layer of gate electrode material and first and second nitrided dielectric layers, resulting in a first gate structure located within the first high voltage device region and a second gate structure located within the second lower voltage device region.

Turning now to FIG. 11, illustrated is a cross-sectional view of the partially completed semiconductor device 300 illustrated in FIG. 10 after conventionally patterning the blanket layer of gate electrode material 1010 and first and second nitrided dielectric layers 520 and 920, resulting in a first gate structure 1110 located within the first high voltage device region 320 and a second gate structure 1120 located within the second lower voltage device region 360. As one would expect, the first gate structure 1110 includes a first nitrided dielectric layer 1113 and a first gate electrode layer 1118, and the second gate structure 1120 includes a second nitrided dielectric layer 1123 and a second gate electrode layer 1128. As is clearly illustrated, the first nitrided dielectric layer 1113 is thicker than the second nitrided dielectric layer 1123. Both the first and second nitrided dielectric layers 1113 and 1123 may advantageously have improved nitrogen non-uniformities therein. After completing the device shown in FIG. 11, the manufacturing of the semiconductor device 300 would continue in a conventional manner, ultimately resulting in a device similar to that illustrated in FIG. 2A.

Figure 12:
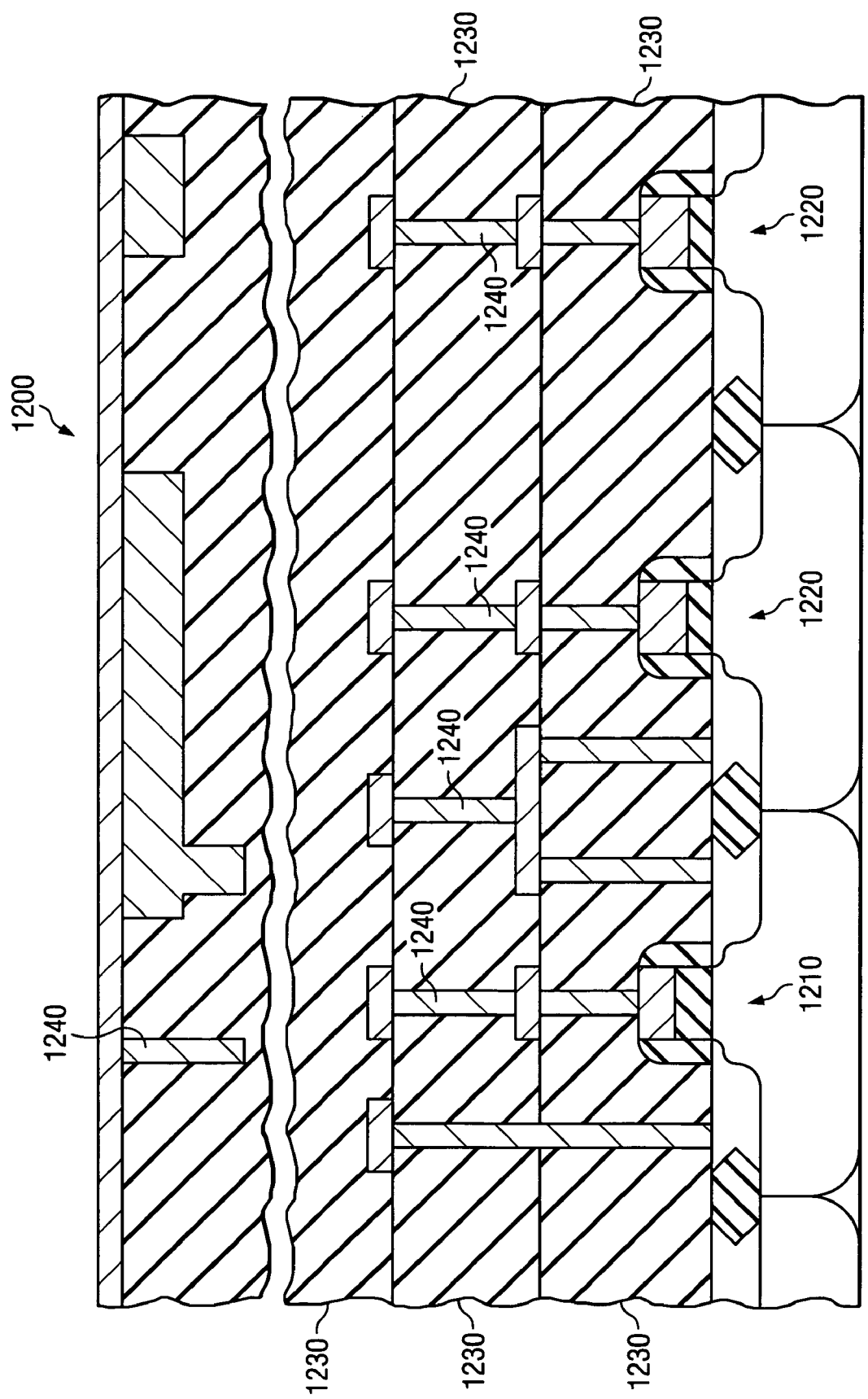
FIG. 12 illustrates an exemplary cross-sectional view of an integrated circuit (IC) incorporating a high voltage device region and a lower voltage device region, including a first nitrided dielectric and a second nitrided dielectric, respectively, formed according to the principles of the present invention.

Finally, turning to FIG. 12, illustrated is an exemplary cross-sectional view of an integrated circuit (IC) 1200 incorporating a high voltage device region 1210 and a lower voltage device region 1220, including a first nitrided dielectric 1213 and a second nitrided dielectric 1223, respectively, formed according to the principles of the present invention. The IC 1200 may include MOS, BiCMOS or bipolar components, and may further include passive components, such as capacitors, inductors or resistors. It may also include optical components or optoelectronic components. Those skilled in the art are familiar with these various types of components and their manufacture. The IC 1200 may also be a dual-voltage IC, comprising transistors operating with difference threshold voltages. The particular embodiment illustrated in FIG. 12 is a dual-voltage IC, as reflected by the high voltage device region 1210 and lower voltage device region 1220.

Dielectric layers 1230 are fabricated over the high voltage device region 1210 and lower voltage device region 1220 using conventional means. Additionally, interconnect structures 1240 are located within the dielectric layers 1230 to interconnect various components, thus forming the operational integrated circuit 1200. It will be apparent to one skilled in the art that several variations of the exemplary interconnect architecture may be fabricated according to the principles of the invention with similarly advantageous results.

Although the present invention has been described in detail, those skilled in the art should understand that they could make various changes, substitutions and alterations herein without departing from the spirit and scope of the invention in its broadest form.

What is claimed is:

1. A method for manufacturing a gate dielectric, comprising:
    forming a nitrided dielectric layer over a substrate, the nitrided dielectric layer having a non-uniformity of nitrogen in a bulk thereof; and
    removing at least a portion of the nitrided dielectric layer using a high temperature chemical treatment, wherein the high temperature chemical treatment employs a first step using a mixture of de-ionized (DI) water, ammonium hydroxide, and hydrogen peroxide, a second step using a mixture of de-ionized (DI) water, hydrochloric acid and hydrogen peroxide, and a third step using a mixture of sulfuric acid and hydrogen peroxide.

2. The method as recited in claim 1 wherein the high temperature chemical treatment uses a temperature ranging from about 65° C. to about 95° C.

3. The method as recited in claim 1 wherein the first step is conducted using a temperature ranging from about 70° C. to about 80° C., the second step is conducted using a temperature ranging from about 70° C. to about 80° C., and the third step is conducted using a temperature ranging from about 70° C. to about 90° C.

4. The method as recited in claim 1 wherein forming a nitrided dielectric layer includes forming a silicon dioxide layer over the substrate and subjecting the silicon dioxide layer to a radical nitridation process.

5. The method as recited in claim 4 wherein the radical nitridation process uses an RF power ranging from about 700 watts to about 1500 watts, a pressure ranging from about 10 mTorr to about 20 mTorr, a temperature ranging from about room temperature to about 400° C., a gas flow of nitrogen ranging from about 100 sccm to about 500 sccm and a time ranging from about 10 seconds to about 60 seconds.

6. The method as recited in claim 4 wherein subjecting the silicon dioxide layer to the radical nitridation process provides a nitrided dielectric layer having a damaged region and an undamaged region, and wherein the removing removes at least a portion of the damaged region.

7. A method for manufacturing a semiconductor device, comprising:
    forming a gate dielectric over a substrate, including;
        forming a nitrided dielectric layer over the substrate, the nitrided dielectric layer having a non-uniformity of nitrogen in a bulk thereof; and
        removing at least a portion of the nitrided dielectric layer using a high temperature chemical treatment, wherein the high temperature chemical treatment employs a first step using a mixture of de-ionized (DI) water, ammonium hydroxide, and hydrogen peroxide, a second step using a mixture of de-ionized (DI) water, hydrochloric acid and hydrogen peroxide, and a third step using a mixture of sulfuric acid and hydrogen peroxide;
    forming a gate electrode over the gate dielectric;
    patterning the gate dielectric and the gate electrode into a gate structure including a gate dielectric layer and a gate electrode layer; and
    forming source/drain regions in the substrate proximate the gate structure.

8. The method as recited in claim 7 wherein the high temperature chemical treatment uses a temperature ranging from about 65° C. to about 95° C.

9. The method as recited in claim 7 wherein forming a nitrided dielectric layer includes forming a silicon dioxide layer over the substrate and subjecting the silicon dioxide layer to a radical nitridation process.

10. The method as recited in claim 9 wherein the radical nitridation process uses an RF power ranging from about 700 watts to about 1500 watts, a pressure ranging from about 10 mTorr to about 20 mTorr, a temperature ranging from about room temperature to about 400° C., a gas flow of nitrogen ranging from about 100 sccm to about 500 sccm and a time ranging from about 10 seconds to about 60 seconds.

11. The method as recited in claim 9 wherein subjecting the silicon dioxide layer to the radical nitridation process provides a nitrided dielectric layer having a damaged region and an undamaged region, and wherein the removing removes at least a portion of the damaged region.

* * * * *